(12) United States Patent
Porras et al.

(10) Patent No.: US 7,935,948 B2
(45) Date of Patent: May 3, 2011

(54) METHOD AND APPARATUS FOR MONITORING AND CONTROL OF SUCK BACK LEVEL IN A PHOTORESIST DISPENSE SYSTEM

(75) Inventors: Erica R. Porras, Los Gatos, CA (US); Natarajan Ramanan, San Jose, CA (US)

(73) Assignee: Sokudo Co., Ltd., Kyoto (JP)

( * ) Notice: Subject to any disclaimer, the term of this patent is extended or adjusted under 35 U.S.C. 154(b) by 1072 days.

(21) Appl. No.: 11/691,468

(22) Filed: Mar. 26, 2007

(65) Prior Publication Data

US 2008/0035666 A1 Feb. 14, 2008

Related U.S. Application Data

(60) Provisional application No. 60/837,441, filed on Aug. 11, 2006.

(51) Int. Cl.
*G01N 15/06* (2006.01)
*G01N 21/00* (2006.01)
*G01F 23/00* (2006.01)

(52) U.S. Cl. ........ 250/573; 250/576; 250/577; 356/440; 73/293

(58) Field of Classification Search .................. 250/573, 250/576–577, 221, 222.1, 222.2; 356/440, 356/614; 73/293, 861; 118/684, 694, 712
See application file for complete search history.

(56) References Cited

U.S. PATENT DOCUMENTS

| | | | |
|---|---|---|---|
| 4,734,572 A * | 3/1988 | Gorman | 250/202 |
| 6,617,079 B1 | 9/2003 | Pillion et al. | |
| 7,357,842 B2 | 4/2008 | Ishikawa et al. | |
| 2006/0130747 A1 | 6/2006 | Ishikawa et al. | |
| 2006/0182536 A1 | 8/2006 | Rice et al. | |
| 2007/0251450 A1 * | 11/2007 | Lin | 118/684 |

OTHER PUBLICATIONS

International Search Report and Written Opinion of PCT Application No. PCT/US07/75498, dated Mar. 28, 2008, 10 pages total.

* cited by examiner

*Primary Examiner* — Georgia Y Epps
*Assistant Examiner* — Don Williams
(74) *Attorney, Agent, or Firm* — Kilpatrick Townsend & Stockton LLP

(57) ABSTRACT

An apparatus for monitoring a position of a semiconductor process fluid interface in a dispense nozzle includes an extended optical source adapted to provide an optical beam propagating along an optical path. The optical beam is characterized by a path width measured in a first direction aligned with a dispense direction. The apparatus also includes an optical detector coupled to the optical path and adapted to detect at least a portion of the optical beam and a dispense nozzle disposed along the optical path at a location between the extended optical source and the optical detector. The apparatus further includes a nozzle positioning member coupled to the dispense nozzle and adapted to translate the dispense nozzle in the first direction.

12 Claims, 12 Drawing Sheets

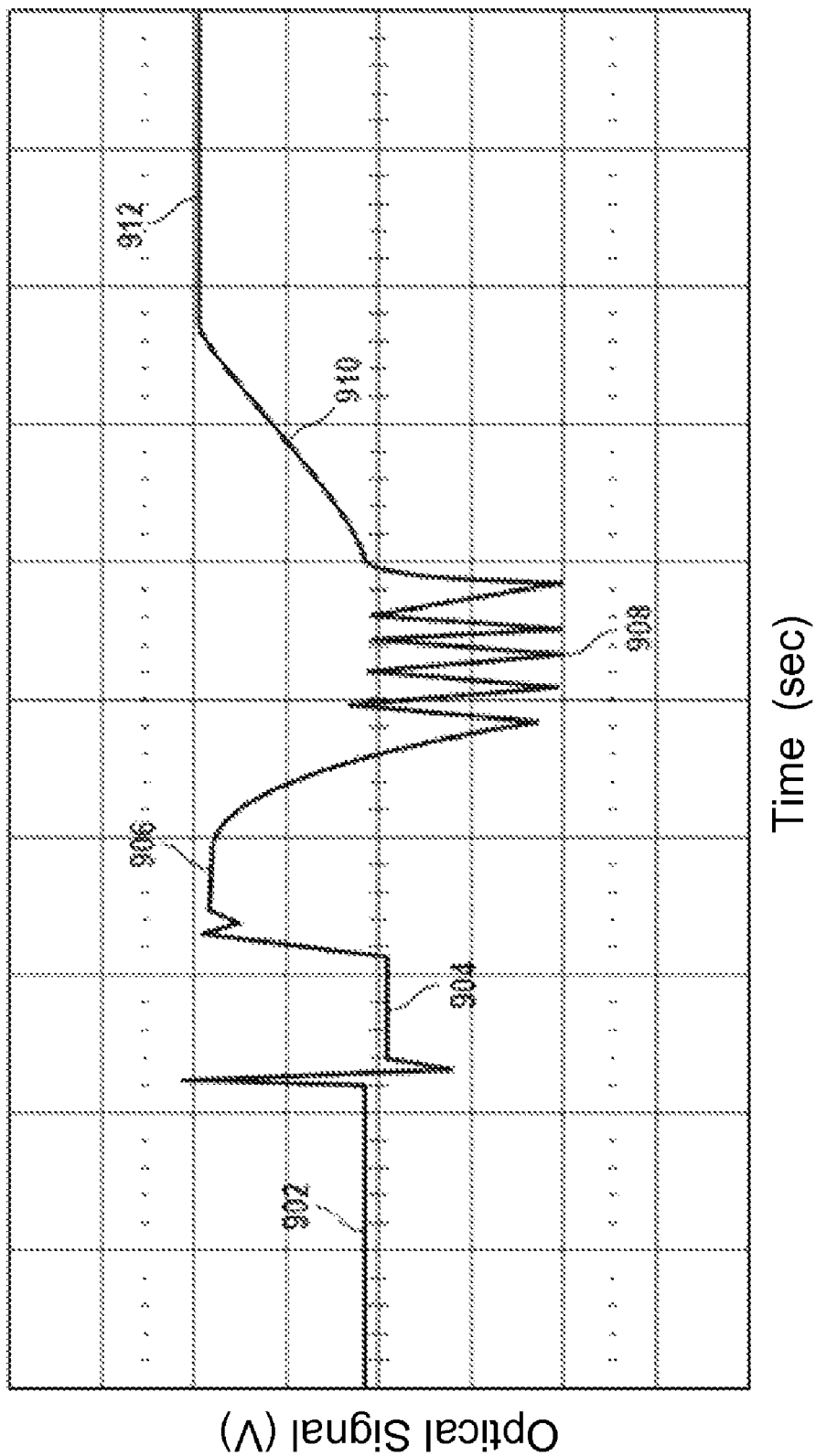

METHOD AND APPARATUS FOR MONITORING AND CONTROL OF SUCK BACK LEVEL IN A PHOTORESIST DISPENSE SYSTEM

CROSS-REFERENCES TO RELATED APPLICATIONS

The present application claims the benefit under 35 U.S.C. §119(e) of U.S. Provisional Patent Application No. 60/837,441, filed Aug. 11, 2006, entitled "Method and Apparatus for Monitoring and Control of Suck Back Level in a Photoresist Dispense System," which is incorporated herein by reference in its entirety.

BACKGROUND OF THE INVENTION

The present invention relates generally to the field of substrate processing equipment. More particularly, the present invention relates to a method and apparatus for monitoring and control of fluids used to process semiconductors. Merely by way of example, the method and apparatus of the present invention are used to monitor and control fluids, for example photoresist, in a photolithography coating system. The method and apparatus can be applied to other processes for semiconductor substrates including chemical mechanical polishing.

Modern integrated circuits contain millions of individual elements that are formed by patterning the materials, such as silicon, metal and dielectric layers, that make up the integrated circuit to sizes that are small fractions of a micrometer. The technique used throughout the industry for forming such patterns is photolithography. A typical photolithography process sequence generally includes depositing one or more uniform photoresist (resist) layers on the surface of a substrate, drying and curing the deposited layers, patterning the substrate by exposing the photoresist layer to radiation that is suitable for modifying the exposed layer, and then developing the patterned photoresist layer.

It is common in the semiconductor industry for many of the steps associated with the photolithography process to be performed in a multi-chamber processing system (e.g., a cluster tool) that has the capability to sequentially process semiconductor wafers in a controlled manner. One example of a cluster tool that is used to deposit (i.e., coat) and develop a photoresist material is commonly referred to as a track lithography tool.

Track lithography tools typically include a mainframe that houses multiple chambers (which are sometimes referred to herein as stations) dedicated to performing the various tasks associated with pre- and post-lithography processing. There are typically both wet and dry processing chambers within track lithography tools. Wet chambers include coat and/or develop bowls, while dry chambers include thermal control units that house bake and/or chill plates. Track lithography tools also frequently include one or more pod/cassette mounting devices, such as an industry standard FOUP (front opening unified pod), to receive substrates from and return substrates to the clean room, multiple substrate transfer robots to transfer substrates between the various stations of the track tool and an interface that allows the tool to be operatively coupled to a lithography exposure tool in order to transfer substrates into the exposure tool and to receive substrates after they have been processed within the exposure tool.

Over the years there has been a strong push within the semiconductor industry to shrink the size of semiconductor devices. The reduced feature sizes have caused the industry's tolerance to process variability to shrink, which in turn, has resulted in semiconductor manufacturing specifications having more stringent requirements for process uniformity and repeatability. An important factor in minimizing process variability during track lithography processing sequences is to ensure that every substrate processed within the track lithography tool for a particular application has the same "wafer history." A substrate's wafer history is generally monitored and controlled by process engineers to ensure that all of the device fabrication processing variables that may later affect a device's performance are controlled, so that all substrates in the same batch are always processed the same way.

A component of the "wafer history" is the thickness, uniformity, repeatability, and other characteristics of the photolithography chemistry, which includes, without limitation, photoresist, developer, and solvents. Generally, during photolithography processes, a substrate, for example a semiconductor wafer, is rotated on a spin chuck at predetermined speeds while fluids and gases such as solvents, photoresist, developer, and the like are dispensed onto the surface of the substrate. Typically, the wafer history will depend on the process parameters associated with the photolithography process.

As an example, an inadequate volume of photoresist dispensed during a coating operation will generally impact the uniformity and thickness of coatings formed on the substrate. Additionally, the dispense rate of the photoresist will generally impact film properties, including the lateral spreading of the resist in the plane of the substrate. In some instances it is desirable to control both the volume and dispense rate of the photoresist applied to the substrate with respect to both the accuracy (e.g., total volume per dispense event) and repeatability (e.g., difference in volume per dispense over a series of dispense events) of the dispense process.

Conventional techniques for monitoring and controlling dispense operations for semiconductor process fluids are less than ideal. For example, manual calibration of the dispense volume of photoresist applied to the substrate has been provided to improve the accuracy and repeatability of the dispense process. The manual calibration of dispense volume can be performed by dispensing a controlled volume into a small pre-weighed cup and moving the cup to a gravimetric scale, or by dispensing the controlled volume into a graduated cylinder. However, these manual calibrations do not provide the level of versatility, automation, and speed desirable for current and future track lithography tools. In addition, manual calibrations do not account for unexpected drift and errors during processing. Therefore, there is a need in the art for an improved method and apparatus for monitoring and controlling the dispense of process fluids in a photolithography system.

SUMMARY OF THE INVENTION

According to an embodiment of the present invention, an apparatus for monitoring a position of a semiconductor process fluid interface in a dispense nozzle is provided. The apparatus includes an extended optical source adapted to provide an optical beam propagating along an optical path. The optical beam is characterized by a path width measured in a first direction aligned with a dispense direction. The apparatus also includes an optical detector coupled to the optical path and adapted to detect at least a portion of the optical beam and a dispense nozzle disposed along the optical path at a location between the extended optical source and the optical detector. The apparatus further includes a nozzle positioning member coupled to the dispense nozzle and adapted to translate the dispense nozzle in the first direction.

According to another embodiment of the present invention, a method of providing a predetermined fluid level of a dispense fluid in a dispense nozzle of a semiconductor process module is provided. The method includes a) providing an optical beam propagating along an optical path, wherein the optical beam is provided by an optical source and b) positioning the dispense nozzle along the optical path at a first location between the optical source and an optical detector coupled to the optical path. The first location is characterized by a first position measured along a first direction aligned with a dispense direction such that the optical beam impinges on the dispense nozzle. The method also includes c) establishing a first fluid level recessed a first distance from a tip of the dispense nozzle, d) measuring a first optical signal utilizing the optical detector, and e) establishing a second fluid level recessed a second distance from the tip of the dispense nozzle. The second distance is greater than the first distance. The method further includes f) measuring a second optical signal utilizing the optical detector and g) repeating steps (e) and (f) until a meniscus of the dispense fluid is associated with the predetermined fluid level.

According to an alternative embodiment of the present invention, a system for controlling a semiconductor process fluid dispense operation is provided. The system includes an extended optical source adapted to provide an optical beam propagating along an optical path. The optical beam is characterized by a path width measured in a first direction aligned with a dispense direction. The system also includes an optical detector coupled to the optical path and adapted to detect at least a portion of the optical beam and to provide an optical signal and a dispense nozzle disposed along the optical path at a location between the extended optical source and the optical detector. The dispense nozzle is adapted to support the semiconductor process fluid. The system further includes a suck back valve coupled to the dispense nozzle and adapted to modify a position of a semiconductor process fluid interface in the dispense nozzle and a processor coupled to the optical detector and the suck back valve. The processor is adapted to adjust the position of the semiconductor process fluid interface in response to the optical signal provided by the optical detector.

Many benefits are achieved by way of the present invention over conventional techniques. For example, embodiments of the present invention provide methods and systems that provide improve monitoring (e.g., real time monitoring) of fluid levels in dispense systems. Moreover, embodiments described herein may be utilized to control dispense fluid levels in response to monitoring data. As a result, system stability is improved and early warning signals are detected, potentially preventing system failure. Depending upon the embodiment, one or more of these benefits, as well as other benefits, may be achieved. These and other benefits will be described in more detail throughout the present specification and more particularly below in conjunction with the following drawings.

BRIEF DESCRIPTION OF THE DRAWINGS

FIG. 9 is a graph of the optical signal from an optical detector corresponding to various positions of a fluid interface and various flow characteristics of the fluid according to an embodiment of the present invention.

DETAILED DESCRIPTION OF SPECIFIC EMBODIMENTS

According to the present invention, techniques related to the field of semiconductor processing equipment are provided. More particularly, the present invention includes a method and apparatus for monitoring and control of fluids used to process semiconductors. Merely by way of example, the method and apparatus of the present invention have been applied to monitor and control fluids, for example photoresist, dispensed in a photolithography coating system. The method and apparatus can be applied to other processes for semiconductor substrates including chemical mechanical polishing.

Figure 1:
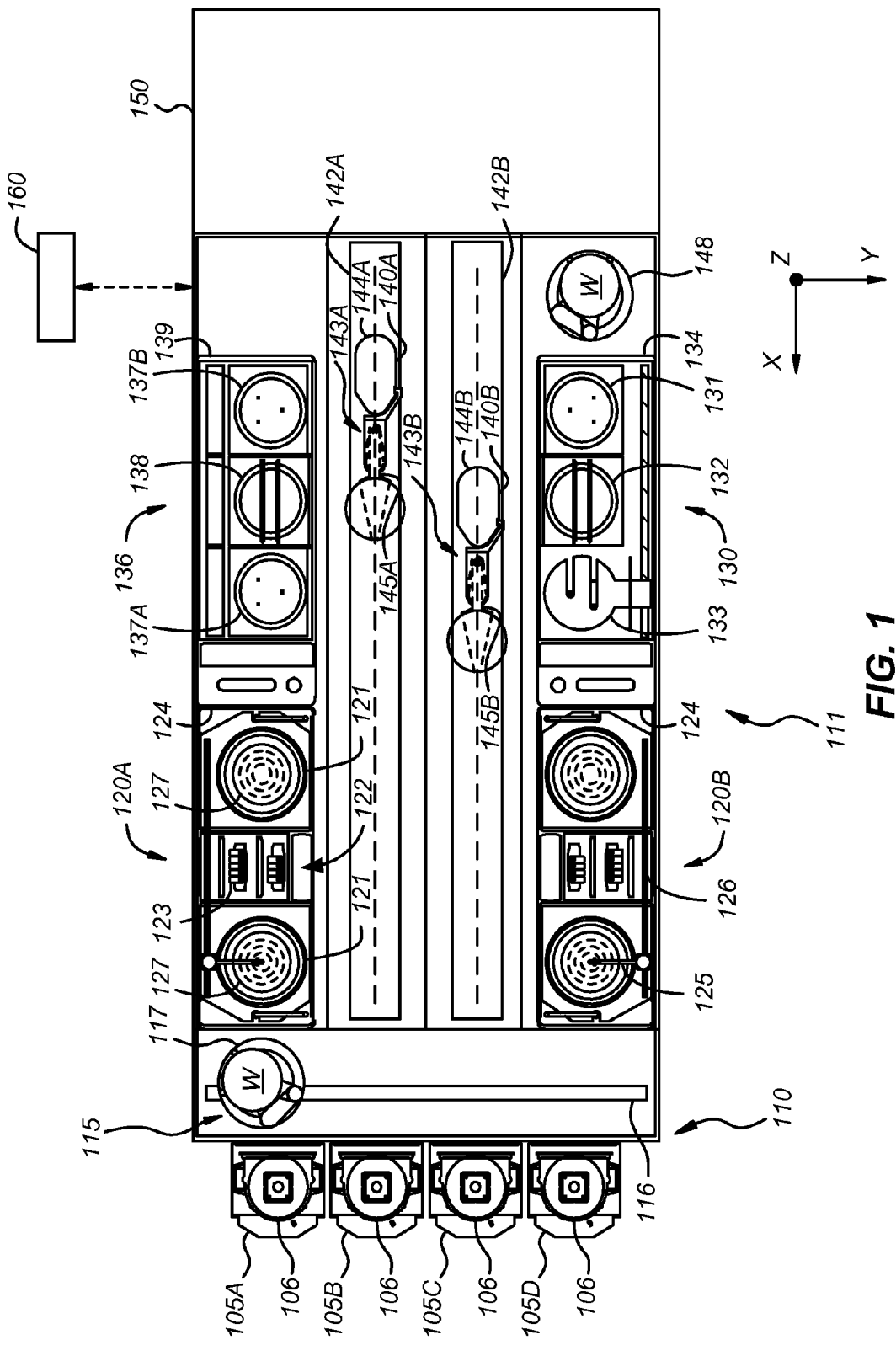
FIG. 1 is a simplified plan view of a track lithography tool according to an embodiment of the present invention.

FIG. 1 is a plan view of an embodiment of a track lithography tool in which the embodiments of the present invention may be used. As illustrated in FIG. 1, the track lithography tool contains a front end module 110 (sometimes referred to as a factory interface) and a process module 111. In other embodiments, the track lithography tool includes a rear module (not shown), which is sometimes referred to as a scanner interface. Front end module 110 generally contains one or more pod assemblies or FOUPS (e.g., items 105A-D) and a front end robot assembly 115 including a horizontal motion assembly 116 and a front end robot 117. The front end module 110 may also include front end processing racks (not shown). The one or more pod assemblies 105A-D are generally adapted to accept one or more cassettes 106 that may contain one or more substrates or wafers that are to be processed in the track lithography tool. The front end module 110 may also contain one or more pass-through positions (not shown) to link the front end module 110 and the process module 111.

Process module 111 generally contains a number of processing racks 120A, 120B, 130, and 136. As illustrated in FIG. 1, processing racks 120A and 120B each include a coater/developer module with shared dispense 124. A coater/developer module with shared dispense 124 includes two coat bowls 121 positioned on opposing sides of a shared dispense bank 122, which contains a number of dispense nozzles 123 providing processing fluids (e.g., bottom anti-reflection coating (BARC) liquid, resist, developer, and the like) to a wafer mounted on a substrate support 127 located in the coat bowl 121. In the embodiment illustrated in FIG. 1, a nozzle positioning member 125 sliding along a track 126 is able to pick up a dispense nozzle 123 from the shared dispense bank 122 and position the selected dispense nozzle over the wafer for dispense operations. Coat bowls with dedicated dispense banks are provided in alternative embodiments.

Processing rack 130 includes an integrated thermal unit 134 including a bake plate 131, a chill plate 132 and a shuttle 133. The bake plate 131 and the chill plate 132 are utilized in heat treatment operations including post exposure bake (PEB), post-resist bake, and the like. In some embodiments the shuttle 133, which moves wafers in the x-direction between the bake plate 131 and the chill plate 132, is chilled to provide for initial cooling of a wafer after removal from the bake plate 131 and prior to placement on the chill plate 132. Moreover, in other embodiments shuttle 133 is adapted to move in the z-direction, enabling the use of bake and chill plates at different z-heights. Processing rack 136 includes an integrated bake and chill unit 139, with two bake plates 137A and 137B served by a single chill plate 138.

One or more robot assemblies (robots) 140 are adapted to access the front-end module 110, the various processing modules or chambers retained in the processing racks 120A, 120B, 130, and 136, and the scanner 150. By transferring substrates between these various components, a desired processing sequence can be performed on the substrates. The two robots 140 illustrated in FIG. 1 are configured in a parallel processing configuration and travel in the x-direction along horizontal motion assembly 142. Utilizing a mast structure (not shown), the robots 140 are also adapted to move orthogonal to the transfer direction. Utilizing one or more of three directional motion capabilities, robots 140 are able to place wafers in and transfer wafers between the various processing chambers retained in the processing racks that are aligned along the transfer direction.

Referring to FIG. 1, the first robot assembly 140A and the second robot assembly 140B are adapted to transfer substrates to the various processing chambers contained in the processing racks 120A, 120B, 130, and 136. In one embodiment, to perform the process of transferring substrates in the track lithography tool, robot assembly 140A and robot assembly 140B are similarly configured and include at least one horizontal motion assembly 142, a vertical motion assembly 144, and a robot hardware assembly 143 supporting a robot blade 145. Robot assemblies 140 are in communication with a controller 160 that controls the system. In the embodiment illustrated in FIG. 1, a rear robot assembly 148 is also provided.

The scanner 150 is a lithographic projection apparatus used, for example, in the manufacture of integrated circuits. The scanner 150 exposes a photosensitive material that was deposited on the substrate in the cluster tool to some form of radiation to generate a circuit pattern corresponding to an individual layer of the integrated circuit device to be formed on the substrate surface.

Each of the processing racks 120A, 120B, 130, and 136 contain multiple processing modules in a vertically stacked arrangement. That is, each of the processing racks may contain multiple stacked coater/developer modules with shared dispense 124, multiple stacked integrated thermal units 134, multiple stacked integrated bake and chill units 139, or other modules that are adapted to perform the various processing steps required of a track photolithography tool. As examples, coater/developer modules with shared dispense 124 may be used to deposit a bottom antireflective coating (BARC) and/or deposit and/or develop photoresist layers. Integrated thermal units 134 and integrated bake and chill units 139 may perform bake and chill operations associated with hardening BARC and/or photoresist layers after application or exposure.

In one embodiment, controller 160 is used to control all of the components and processes performed in the cluster tool. The controller 160 is generally adapted to communicate with the scanner 150, monitor and control aspects of the processes performed in the cluster tool, and is adapted to control all aspects of the complete substrate processing sequence. The controller 160, which is typically a microprocessor-based controller, is configured to receive inputs from a user and/or various sensors in one of the processing chambers and appropriately control the processing chamber components in accordance with the various inputs and software instructions retained in the controller's memory. The controller 160 generally contains memory and a CPU (not shown) which are utilized by the controller to retain various programs, process the programs, and execute the programs when necessary. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 160 determines which tasks are performable in the processing chambers. Preferably, the program is software readable by the controller 160 and includes instructions to monitor and control the process based on defined rules and input data.

It is to be understood that embodiments of the invention are not limited to use with a track lithography tool such as that depicted in FIG. 1, but may be used in any track lithography tool including the many different tool configurations described in U.S. patent application Ser. No. 11/112,281 entitled "Cluster Tool Architecture for Processing a Substrate" filed on Apr. 22, 2005, and Ser. No. 11/315,984 entitled "Cartesian Robot Cluster Tool Architecture" filed on Dec. 22, 2005, both of which are hereby incorporated by reference for all purposes. In addition, embodiments of the invention may be used in other semiconductor processing equipment.

Generally, track lithography tools are used to dispense precise amounts of expensive lithography chemicals onto substrates to form thin, uniform coatings. For modern lithography processes, the volumes of chemicals, such as photoresist, dispensed per event are small, for example, ranging from about 0.5 ml to about 5.0 ml. The volume of chemical dispensed, and the flow rate during the dispense operation, among other variables, are controlled during the process of dispensing the lithography chemicals. Preferably, control of the dispense operations in a track lithography tool provide actual dispensed volumes with an accuracy of ±0.02 milliliters (ml) and repeatability from dispense event to dispense event of 3σ<0.02 ml.

A wide variety of photolithography chemicals are utilized in track lithography tools according to embodiments of the present invention. For example, photoresist, bottom anti-reflective coating (BARC), top anti-reflective coating (TARC), top coat (TC), Safier, and the like are dispensed onto the substrate. In some embodiments, after the selected chemical is dispensed, the substrate is spun to create a uniform thin coat on an upper surface of the substrate. Generally, to provide the levels of uniformity desired of many photolithography processes, dispense events start with a solid column of chemical. The flow rate is generally set at a predetermined rate as appropriate to a particular chemical delivery process. For example, the flow rate of the fluid is selected to be greater than a first rate in order to prevent the fluid from drying out prior to dispense. At the same time, the flow rate is selected to be less than a second rate in order to maintain the impact of the fluid striking the substrate below a threshold value.

As the dispense event is terminated, the fluid is typically drawn back into the dispense nozzle, sometimes referred to as a suck back process utilizing a suck back valve. In some track lithography tools, the fluid is brought back into the dispense nozzle to a level about 1-2 mm from the end of the dispense nozzle forming a reverse meniscus. This suck back process prevents the lithography chemicals from dripping onto the substrate and prevents the chemicals from drying out inside the dispense nozzle. Monitoring and controlling this suck back level is utilized to reduce variability in the volume of fluid dispensed during each dispense event.

Figure 2:
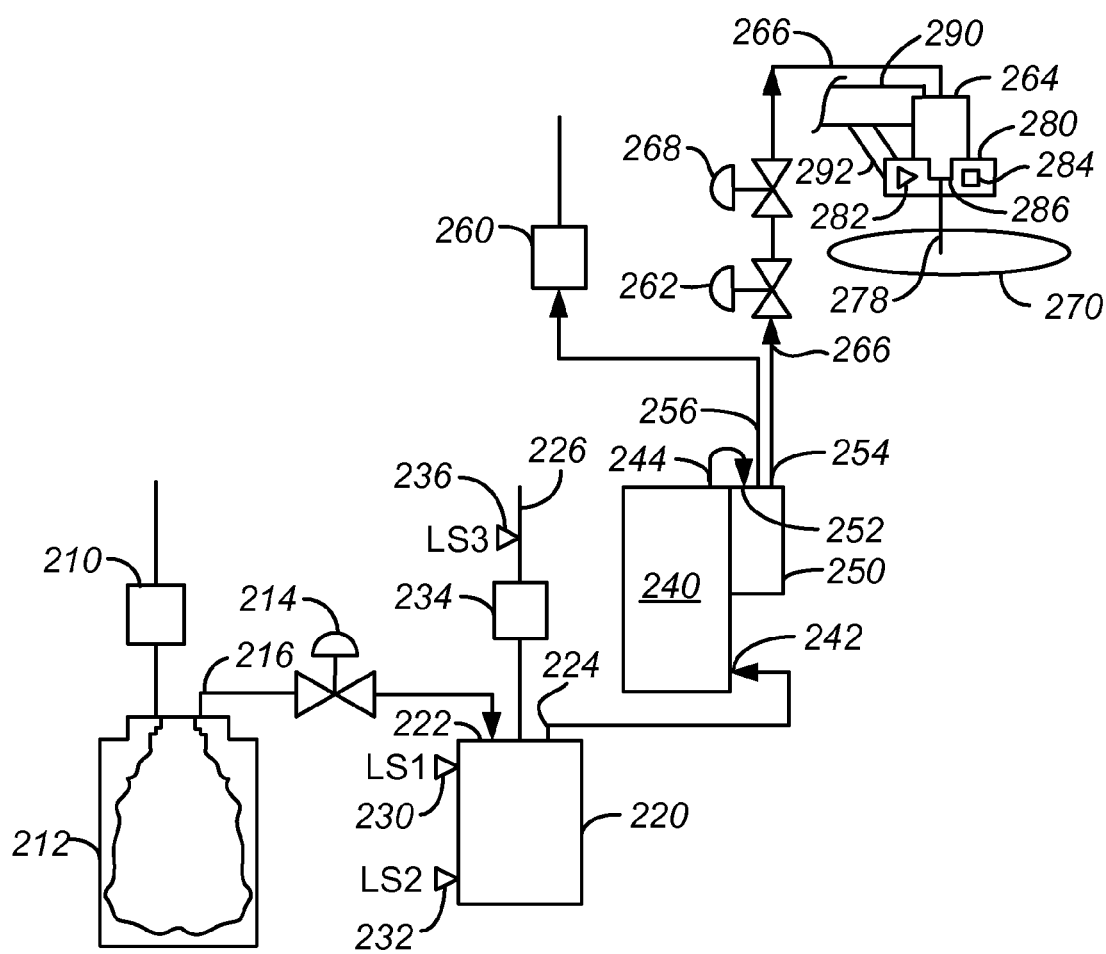
FIG. 2 is a simplified schematic illustration of a photolithography chemical dispense apparatus according to an embodiment of the present invention.

FIG. 2 is a simplified schematic illustration of a photolithography chemical dispense apparatus according to an embodiment of the present invention. A pressure valve 210 is coupled to a source bottle 212 containing the photolithography chemical to be dispensed onto the substrate surface. The source bottle is coupled to a flow control valve 214 and adapted to regulate the flow of the photolithography chemical in fluid line 216. Buffer vessel 220 is illustrated in FIG. 2 and includes an input port 222, an output port 224, and a vent port 226. The input port 222 of the buffer vessel 220 is coupled to the fluid line 216. As illustrated in FIG. 2, the buffer vessel includes a number of level sensors, for example, level sensor LS1 (230) and level sensor LS2 (232). As described more fully below, the level sensors are utilized to regulate the volume of photolithography chemical present in the buffer vessel 220.

The vent port 226 of the buffer vessel is coupled to a vent valve 234 and a level sensor LS3 (236). Level sensor LS3 serves to monitor the level of fluid passing through the vent valve 234. The output port 224 of the buffer vessel is coupled to input port 242 of dispense pump 240. As illustrated in FIG. 2, a filter 250 is integrated with the dispense pump 240 and the output port 244 of the dispense pump is coupled to an input port 252 of the filter 250. A vent port 256 and an output port 254 are provided on the filter 250 and, as illustrated in FIG. 2, a vent valve 260 is coupled to the vent port 256. A flow valve 262 is coupled to a suck back valve 268. A fluid line 266 running from the output port 254 of the filter is coupled to the flow valve. The suck back valve and flow valve are typically provided as a single device. From suck back valve 268, the photolithography chemical passes along fluid line 266 to a proximal end of dispense nozzle 264. The dispense nozzle 264 includes a nozzle tip 286 at the distal end from which a fluid stream 278 exits toward substrate 270. As will be evident to one of skill in the art, additional dispense systems adapted to provide photolithography chemicals, e.g., multi-nozzle systems, are not illustrated for purposes of clarity.

The flow valve 262 and suck back valve 268 can be acquired from several manufacturers and are typically available as a single unit. The suck back valve (SV) typically includes a pneumatic suck back valve with a diaphragm. A gas is applied to the diaphragm under pressure to move the diaphragm. In some embodiments the suck back valve includes a digital suck back valve. The flow valve typically includes an air operated flow valve (AV) which opens as pressure is applied to the flow valve. A first electronic valve (EV) is provided to control gas to the flow valve thereby controlling opening and closing of the flow valve. The flow valve opens when gas is supplied with pressure to the flow valve. The flow valve closes when the gas is exhausted. A second electronic valve (EV) is provided to control gas flow to the suck back valve. As gas is supplied to the suck back valve with pressure, the diaphragm moves to a reset position. As gas supplied to the diaphragm is exhausted, the diaphragm position will move to a suck back position. Thus, the suck back valve is actuated with gas pressure to do a reset, and gas is exhausted to do a suck back. The return of the diaphragm to the reset position provides increased fluid capacity coupled to the fluid line which sucks back the fluid in the line.

Nozzle positioning member 290 positions dispense nozzle 264. A sensor package 280 includes an optical source 282 and an optical detector 284. According to an embodiment of the invention, support 292 rigidly attaches sensor package 280 to the nozzle positioning member 290. The optical detector 284 is adjustable on the nozzle positioning member 290 and can be adjusted as needed to detect optical beam 320 which is provided by the optical source 282. In an alternative embodiment, sensor package 280 is located in a fixed position at a calibration stage, and nozzle positioning member 290 positions dispense nozzle 264 between optical source 282 and optical detector 284 to monitor and control the position of the fluid interface in dispense nozzle 264. Positioning dispense nozzle 264 between optical source 282 and optical detector 284 at a precise location is utilized to accurately determine the position of the process fluid in dispense nozzle 264. The optical signal detected by optical detector 284 is compared to baseline optical signal data to determine the position of the process fluid interface in dispense nozzle 264. Variations in the positioning of dispense nozzle 264 will typically translate into inaccuracy in the determined position of the process fluid in dispense nozzle 264, which may translate into inaccuracy in the determined volume of fluid dispensed during a dispense event.

Figure 3:
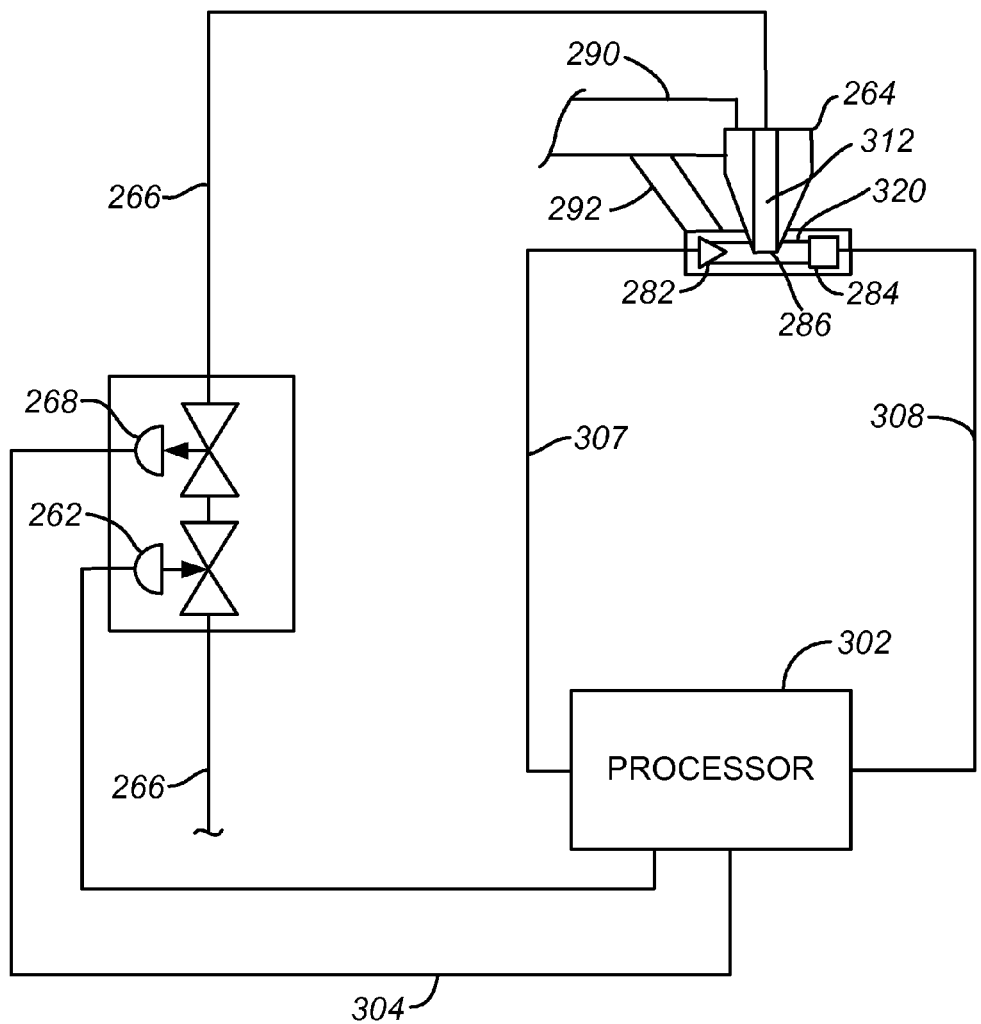
FIG. 3 is a simplified schematic illustration of a system for controlling a process fluid dispense operation according to an embodiment of the present invention.

FIG. 3 is a simplified schematic illustration of a system for controlling a process fluid dispense operation according to an embodiment of the present invention. Processor 302 is connected to optical source 282 with a control line 307, and processor 302 can control an intensity of light generated by optical source 282. Processor 302 is connected to optical detector 284 with a sensor line 308, and sensor line 308 sends an optical signal from optical detector 284 to processor 302. Processor 302 compares the optical signal with baseline optical signal data which corresponds to positions of the process fluid in dispense nozzle 264. Processor 302 is connected to suck back valve 268 with a control line 304, and processor 302 generates an output signal on control line 304 depending on the comparison of the optical signal with the baseline optical signal data. Suck back valve 268 is used to adjust the position of the process fluid interface in dispense nozzle 264 in response to commands from processor 302. Processor 302 is connected to various other valves and pumps (not shown), and processor 302 generates output signals to control the valves and pumps to adjust the dispense conditions.

It is understood that processor 302 can be any device which modifies an electrical signal or is configured to execute instructions and data. In some embodiments, processor 302 may be comprised of dedicated hardware such as an application specific integrated circuit (ASIC). In yet other embodiments, processor 302 may be comprised of a combination of software and hardware. As an example, such processors include dedicated circuitry, ASICs, combinatorial logic, other programmable processors, combinations thereof, and the like. In addition, processor 302 often comprises at least one tangible medium for storing instructions. The tangible medium comprises random access memory (RAM) and can comprise read only memory (ROM), compact disk ROM (CDROM), flash RAM or the like. In some embodiments processor 302 can comprise a distributed network of computers, for example a local area network, an intranet, or Internet. Processor 302 communicates with controller 160, described above, and in some embodiments controller 160 comprises processor 302. Machine readable instructions for performing at least some of the techniques described herein are stored on the tangible medium. For example, processor 302 receives inputs on sensor lines and is programmed to generate output signals on control lines to automatically adjust the dispense operation.

Figure 4A:
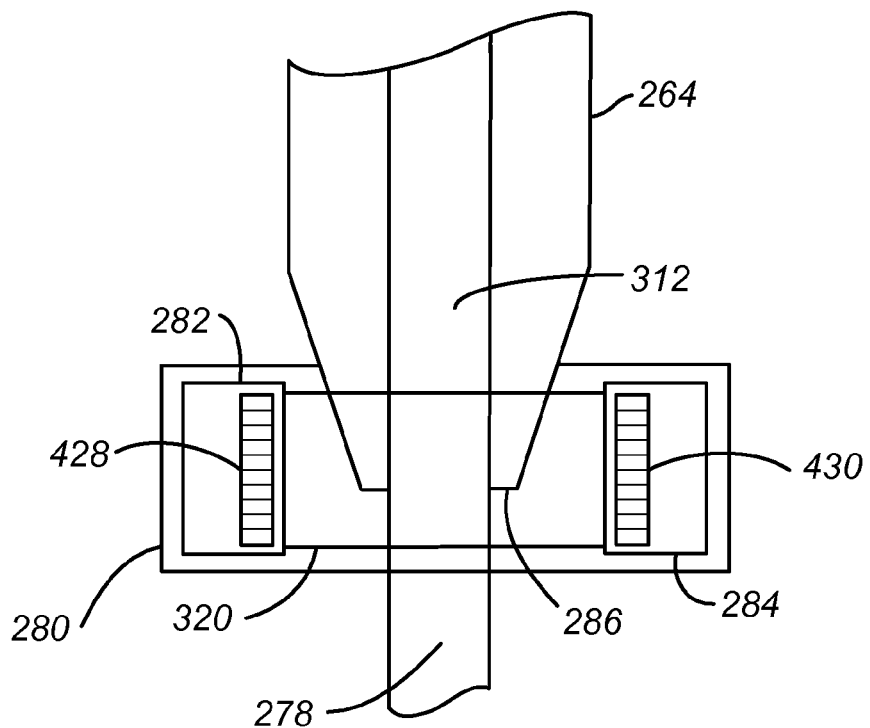
FIGS. 4A-4D are simplified schematic illustrations of a dispense nozzle and an optical system according to an embodiment of the present invention.

FIGS. 4A-4D are simplified schematic illustrations of a dispense nozzle 264 and an optical system 280 according to an embodiment of the present invention. FIG. 4A is a simplified schematic illustration of a stream of process fluid 312 flowing through a dispense nozzle 264 and passing through a portion of the path of an optical beam 320. In some embodiments, optical source 282 is an extended optical source includes an extended optical array 428. Extended optical array 428 is rectangular with the long axis oriented vertically. Extended optical array 428 may include several optical fibers having light emitting ends arranged in a vertical row and adapted to emit light as an extended optical beam 320. Extended optical beam 320 is shaped as a thin sheet of light oriented vertically. In an alternative embodiment, the extended optical array 428 comprises several light emitting diodes (LEDs) arranged in a vertical row. It is understood that optical source 282 is not limited to optical fibers or LEDs, but may comprise various other optical sources or combinations thereof.

Optical source 282 provides an optical beam 320 which propagates to optical detector 284. Optical beam 320 is characterized by a path width that is approximately equal to the width of extended optical array 428. In some embodiments, optical detector 284 includes a light receiving array 430 comprising several optical fibers. The light receiving ends of the optical fibers of light receiving array 430 are arranged in a vertical row and are aligned with optical beam 320. The number and spacing of the fibers in light receiving array 430 are typically similar to extended optical array 428. The light emitting ends of the optical fibers of light receiving array 430 are coupled to a light sensing device. Examples of light sensing devices are photodiodes and light sensing transducers. In other embodiments, the light receiving array 430 is comprised of photodiodes or charge-coupled devices (CCDs) arranged in a vertical row. It is understood that light receiving array 430 is not limited to optical fibers, photodiodes or CCDs, but may comprise any optical sensing device or combinations thereof.

According to an embodiment of the present invention, dispense nozzle 264 is positioned between optical source 282 and optical detector 284 such that dispense nozzle 264 extends through a portion of optical beam 320. As illustrated in FIG. 4A, the portion of optical beam 320 above nozzle tip 286 defines a first portion of optical beam 320, and the portion below nozzle tip 286 defines a second portion of optical beam 320. The first portion of optical beam 320 impinges on dispense nozzle 264. Dispense nozzle 264 includes a light transmissive material that partially transmits optical beam 320. The second portion of optical beam 320 is free from impingement on dispense nozzle 264 and propagates to light receiving array 430. In the configuration illustrated in FIG. 4A, the first portion of optical beam 320 interacts with fluid 312 in dispense nozzle 264, and the second portion of optical beam 320 interacts with fluid stream 278. The intensity of optical beam 320 detected by optical detector 284 is impacted by the interaction of optical beam 320 with fluid 312 and fluid stream 278.

Figure 4B:
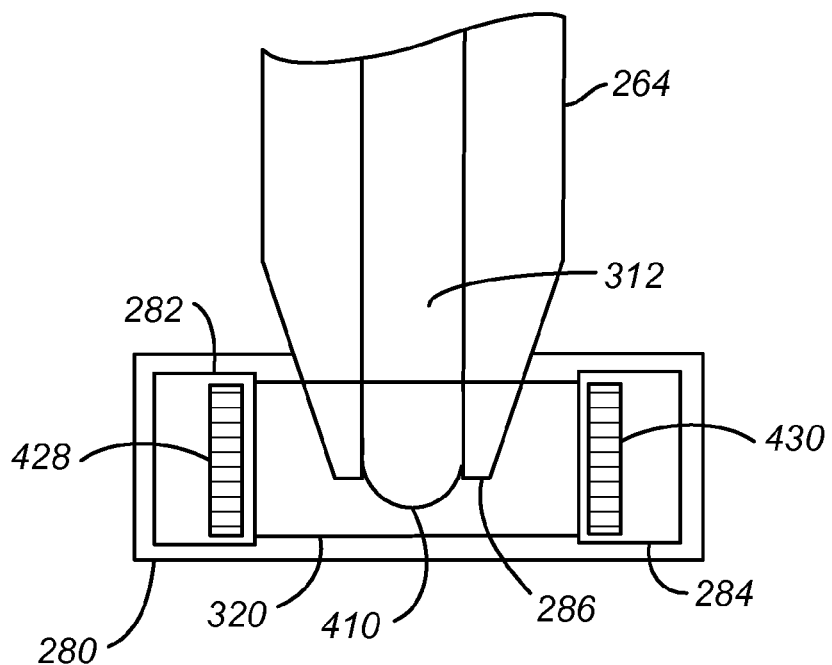

FIG. 4B is a simplified schematic illustration of a drop of fluid 410 protruding into the second portion of optical beam 320 below the nozzle tip 286. As illustrated previously in FIG. 4A, dispense nozzle 264 is positioned to extend through the first portion of optical beam 320. An upper part of the second portion of optical beam 320 impinges on fluid drop 410, and a lower part is transmitted unimpeded to optical detector 284. The first portion of optical beam 320 interacts with fluid 312, and the upper part of the second portion of optical beam 320 interacts with fluid drop 410. The intensity of optical beam 320 detected by optical detector 284 is impacted by the interaction with fluid 312 and fluid drop 410, but the intensity detected is greater than the configuration of FIG. 4A because there is less fluid impacting optical beam 320.

As described throughout the specification and more particularly below, the embodiments illustrated in FIGS. 4A-4D provide methods and systems for monitoring and controlling the fluid in dispense nozzle 264 and the fluid extending beyond nozzle tip 286. For example, the methods and systems provide monitoring and control of the fluid interface level in dispense nozzle 264, and monitoring and control of undesirable dispense conditions such as drops hanging from the nozzle tip 286, post dispense dribbling, and post dispense micro droplet formation. Micro droplets are small droplets that form during stream break up following a dispense event and may be undetectable visually. Micro droplets on the order of 100 µm have been detected using the methods and systems illustrated in the embodiments of FIGS. 4A-4D. The methods and systems include software and hardware programmed to automatically adjust system variables to control dispense conditions.

Figure 4C:
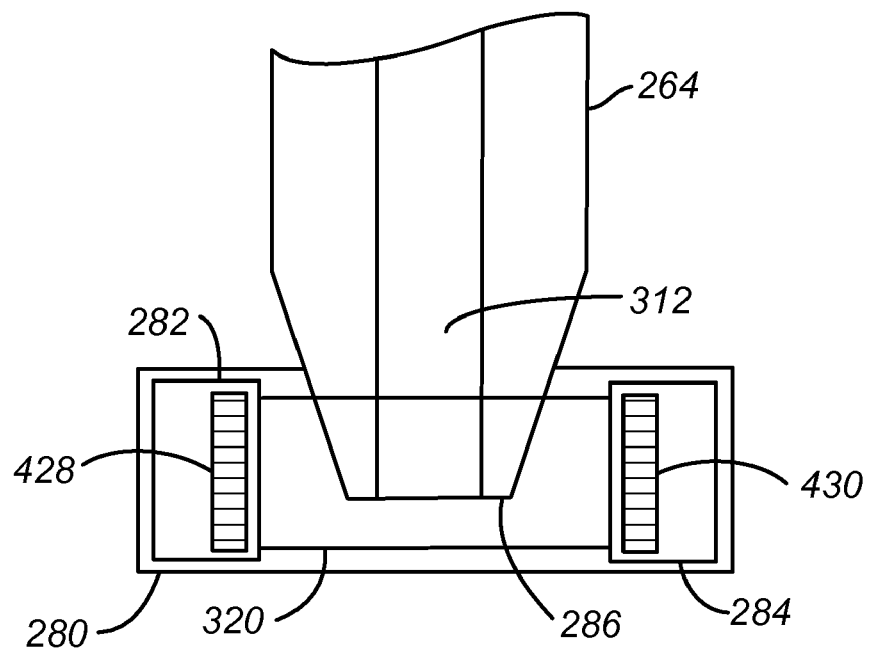
Figure 4D:
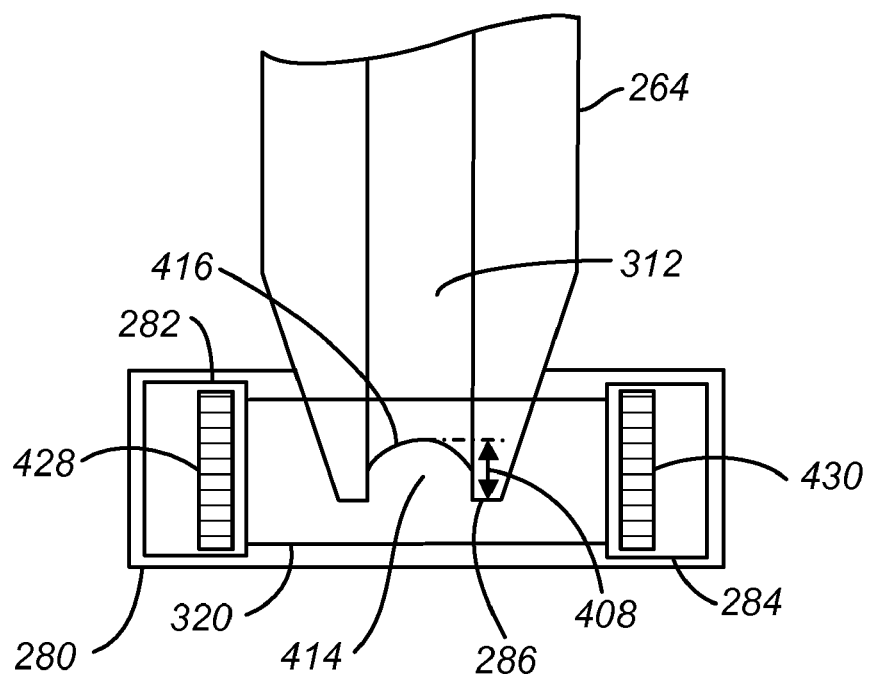

FIG. 4C is a simplified schematic illustration of a fluid flush with the nozzle tip 286. FIG. 4D is a simplified schematic illustration of a fluid drawn back into a dispense nozzle 264, or sucked back away from a nozzle tip 286, and forming a meniscus 416 that is drawn to a height 408 above nozzle tip 286. A gas 414 remains in the dispense nozzle 264 below the meniscus 416. In the configurations illustrated by FIGS. 4C and 4D, the portion of optical beam 320 that impinges on fluid 312 interacts with fluid 312 and impacts the intensity of optical beam 320 that is detected by optical detector 284. In FIG. 4D, the impact on the detected intensity depends on the height 408 of the meniscus 416 above the nozzle tip 286.

Figure 5A:
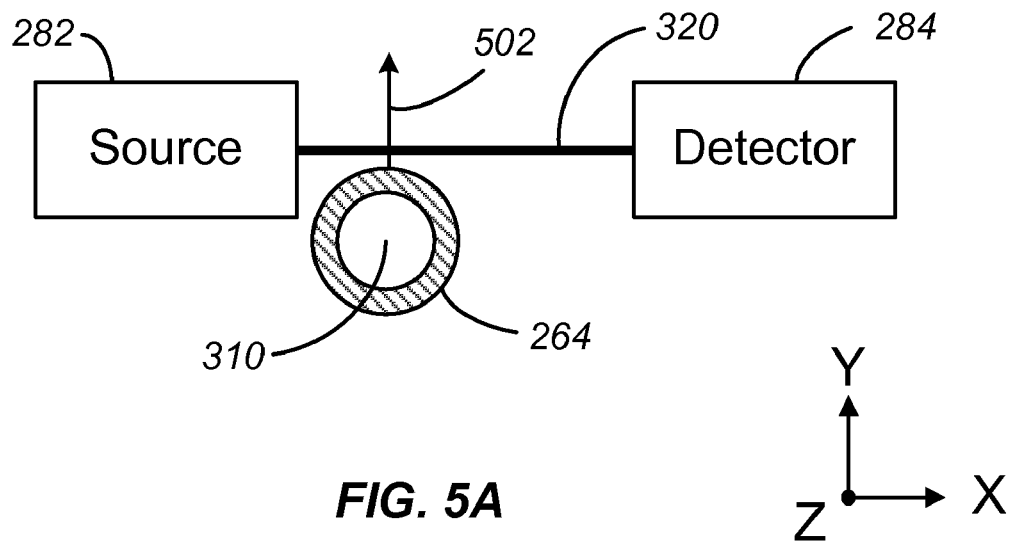
FIGS. 5A-5B are simplified schematic illustrations of a method of positioning a dispense nozzle in a lateral direction according to an embodiment of the present invention.
Figure 5B:
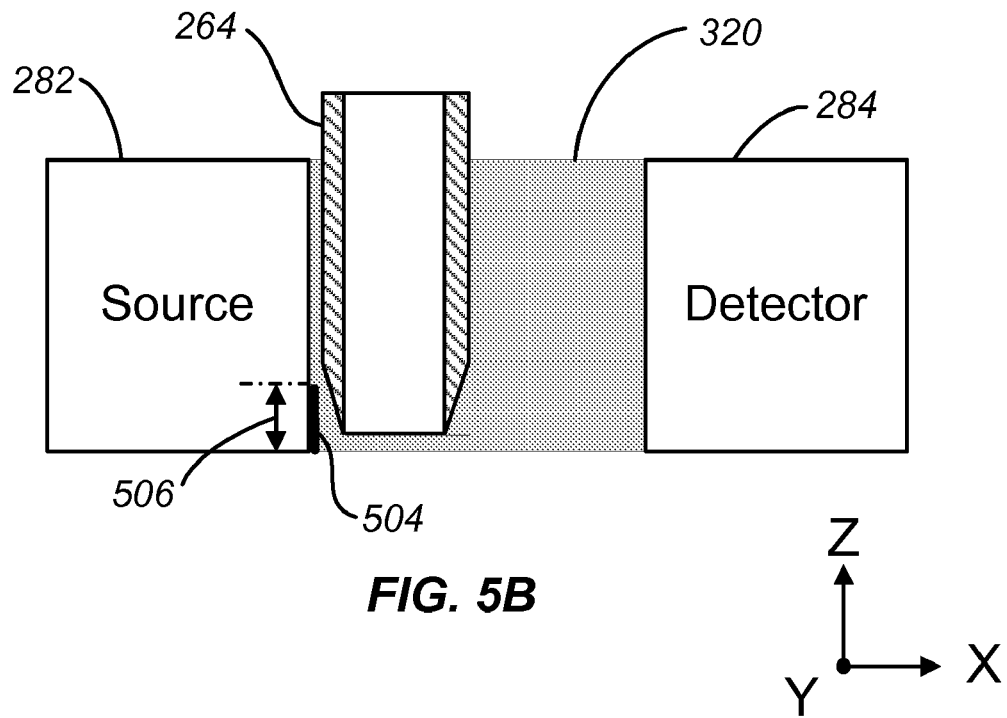

FIGS. 5A-5B are simplified schematic illustrations of a method of positioning a dispense nozzle in a lateral direction according to an embodiment of the present invention. As mentioned previously, positioning dispense nozzle 264 between optical source 282 and optical detector 284 at a precise location is utilized to accurately determine the position of the process fluid interface in dispense nozzle 264. Typically the dispense nozzle 264 is centered laterally within the path of optical beam 320 and positioned vertically to detect the amount of fluid in dispense nozzle 264 and any amount extending beyond the nozzle tip 286.

To position dispense nozzle 264 in the lateral direction, the dispense nozzle 264 is initially positioned such that the distance between dispense nozzle 264 and optical source 282 is less than the distance between dispense nozzle 264 and optical detector 284. Dispense nozzle 264 is also initially positioned to block a majority of optical beam 320 as illustrated in the side view of FIG. 5B. As illustrated in the top view of FIG. 5A, dispense nozzle 264 is positioned on one side of optical beam 320 and is then moved in direction 502 through the path of optical beam 320 to a location on the opposite side of optical beam 320. Translucent filter 504 and translucent filter height 506 are not used for the lateral positioning in some embodiments, but are utilized in the vertical positioning process described below.

Figure 5C:
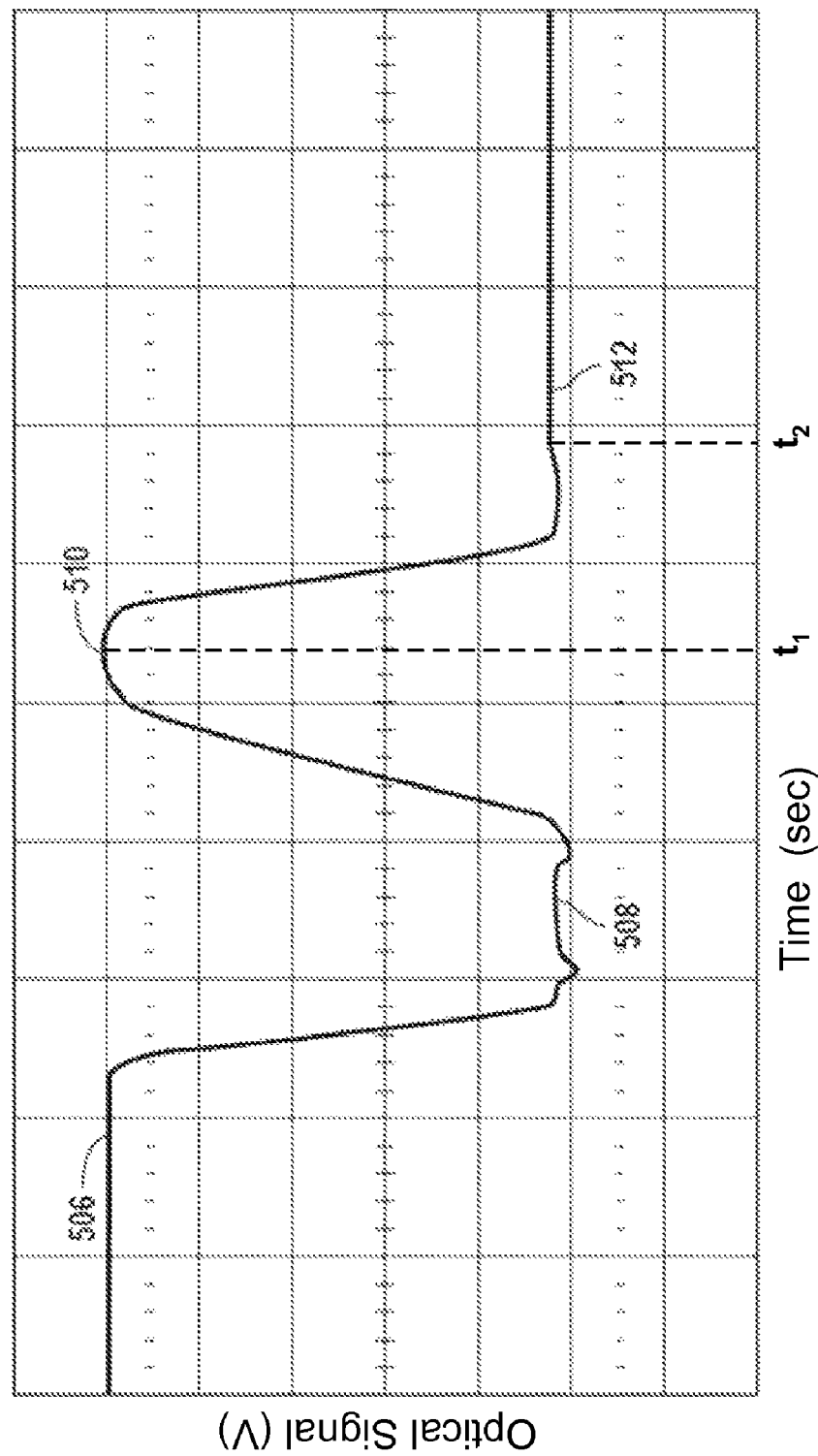
FIG. 5C is a graph of the optical signal from an optical detector as a function of time during the lateral positioning of a dispense nozzle according to an embodiment of the present invention.

FIG. 5C is a graph of the optical signal from optical detector 284 as a function of time during the lateral positioning of dispense nozzle 264 according to an embodiment of the present invention. With reference to FIG. 5A, optical signal 506 is associated with the initial position of dispense nozzle 264 on one side of optical beam 320. Optical signal 508 is associated with dispense nozzle 264 being moved in direction 502 through the path of optical beam 320. Optical signal 510 is associated with the position of dispense nozzle 264 on the opposite side of optical beam 320. Between times $t_1$ and $t_2$ illustrated in FIG. 5C, dispense nozzle 264 is moved in a direction opposite to direction 502 to a position which is approximately centered laterally within the path of optical beam 320. This position is typically determined from the point of a local maximum within optical signal 508. Following time $t_2$, dispense nozzle 264 is stationary in the laterally centered position represented by optical signal 512.

Figure 6A:
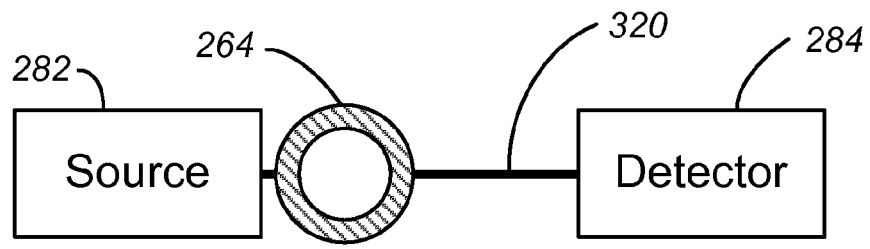
FIGS. 6A-6B are simplified schematic illustrations of a method of positioning a dispense nozzle in a vertical direction according to an embodiment of the present invention.
Figure 6A:
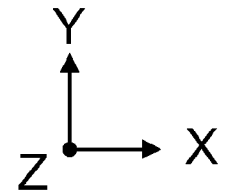
Figure 6B:
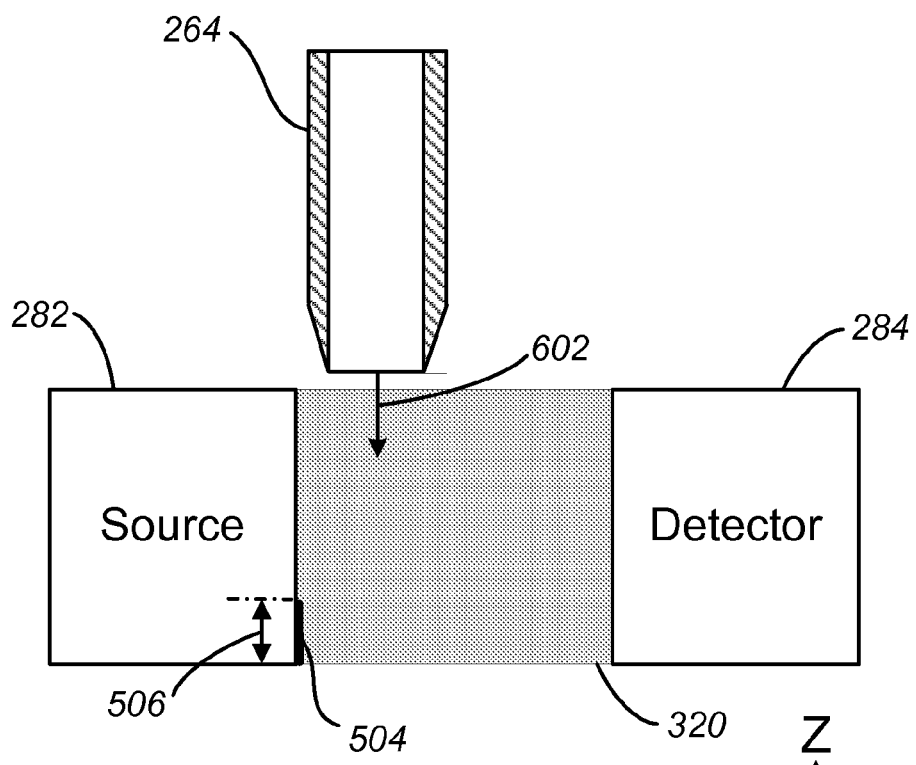
Figure 6B:
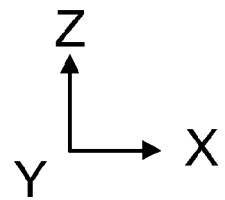

FIGS. 6A-6B are simplified schematic illustrations of a method of positioning a dispense nozzle in a vertical direction according to an embodiment of the present invention. During the vertical positioning process, the dispense nozzle 264 typically remains laterally centered within the path of optical beam 320 as explained previously and as illustrated in the top view of FIG. 6A. As illustrated in the side view of FIG. 6B, dispense nozzle 264 is initially positioned in the vertical direction at a location above the path of optical beam 320 and is then moved in direction 602 downward through the path of optical beam 320.

Figure 6C:
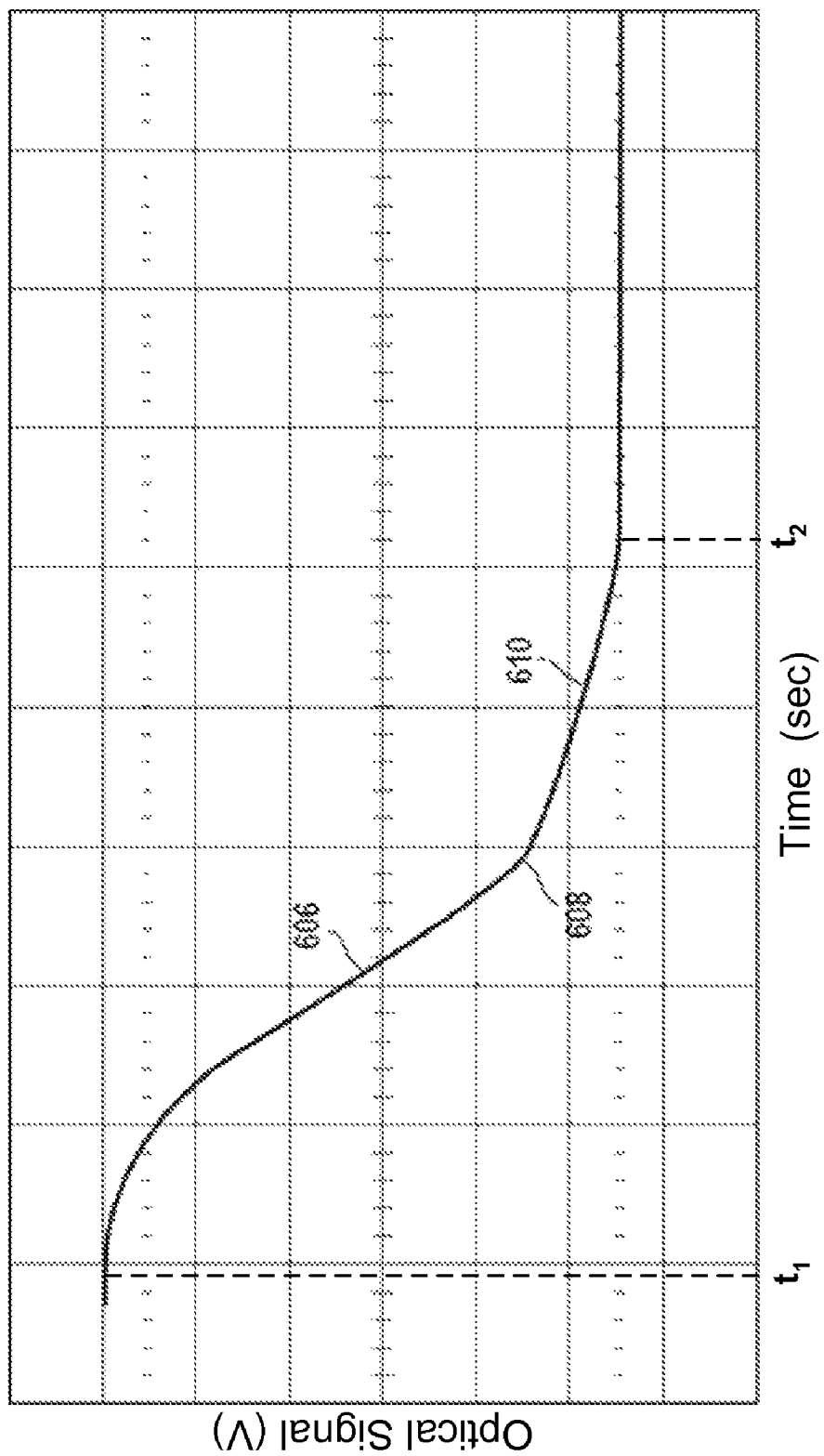
FIG. 6C is a graph of the optical signal from an optical detector as a function of time during the vertical positioning of a dispense nozzle according to an embodiment of the present invention.

FIG. 6C is a graph of the optical signal from optical detector 284 as a function of time during the vertical positioning of dispense nozzle 264 according to an embodiment of the present invention. With reference to FIG. 6B, time $t_1$ of FIG. 6C represents the time nozzle tip 286 moves into the path of optical beam 320 during the initial downward movement of dispense nozzle 264. As dispense nozzle 264 becomes fully inserted into optical beam 320, the optical signal transitions to a region of constant slope represented by optical signal 606. Point 608 represents the time nozzle tip 286 moves into the path of that portion of optical beam 320 which is transmitted through translucent filter 504. Translucent filter 504 is an optical filter which reduces optical intensity, and perturbations to that portion of optical beam 320 which is transmitted through translucent filter 504 have a reduced impact on the optical signal detected by optical detector 284. Optical signal 610 represents dispense nozzle 264 moving through the path of that portion of optical beam 320 which is transmitted through translucent filter 504. Time $t_2$ represents the time at which nozzle tip 268 exits the bottom of the path of optical beam 320.

According to embodiments of the present invention, dispense nozzle 264 is positioned vertically at point 608 which is located at the transition between optical signal 606 and optical signal 610. Positioning dispense nozzle 264 at this location will position nozzle tip 286 in the path of optical beam 320 at approximately the same height as the top edge of translucent filter 504. In some embodiments, the height 506 of translucent filter 504 is a predetermined height, providing for the detection of the amount of fluid in dispense nozzle 264 and extending beyond the nozzle tip 286. In a particular embodiment, the predetermined height is about 5.0 mm. In other embodiments, the predetermined height ranges from about 0 mm to about 20 mm, depending on the particular applications. One of ordinary skill in the art would recognize many variations, modifications, and alternatives.

Figure 7A:
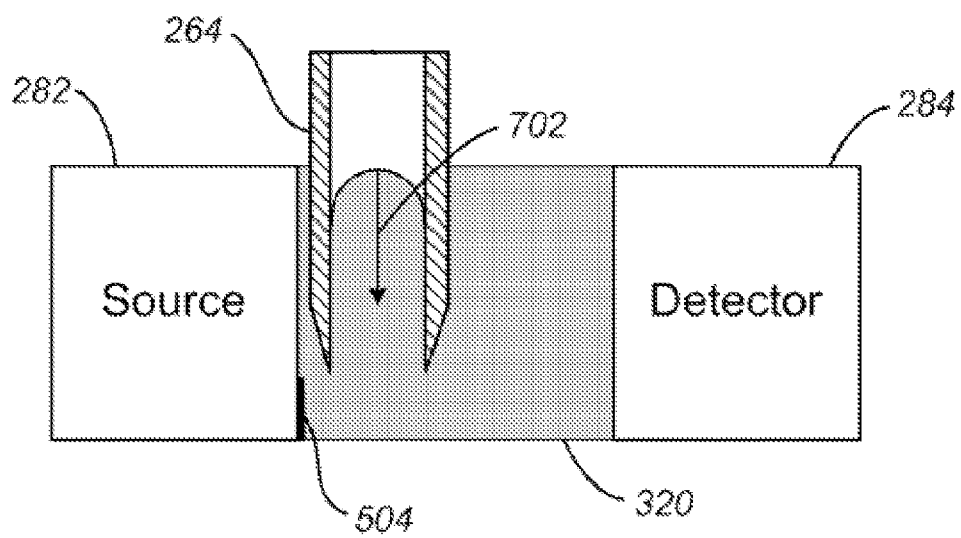
FIG. 7A is a simplified schematic illustration of a method of pulsing a fluid in a dispense nozzle according to an embodiment of the present invention.

FIG. 7A is a simplified schematic illustration of a method of pulsing a fluid in a dispense nozzle according to an embodiment of the present invention. In some applications, the position of the process fluid in dispense nozzle 264 will utilize a calibration process to ensure that the optical signal for a given position matches baseline optical signal data, or to gather initial optical signal data to be used in establishing a baseline. The fluid in dispense nozzle 264 is pulsed, or moved through a range of positions, to obtain optical signal data that can be correlated with process fluid position. FIG. 7A illustrates a pulsing sequence where the fluid is moved in direction 702 from a position within dispense nozzle 264 towards the nozzle tip 286. In some embodiments, the pulsing sequence includes extending the fluid beyond nozzle tip 286.

Figure 7B:
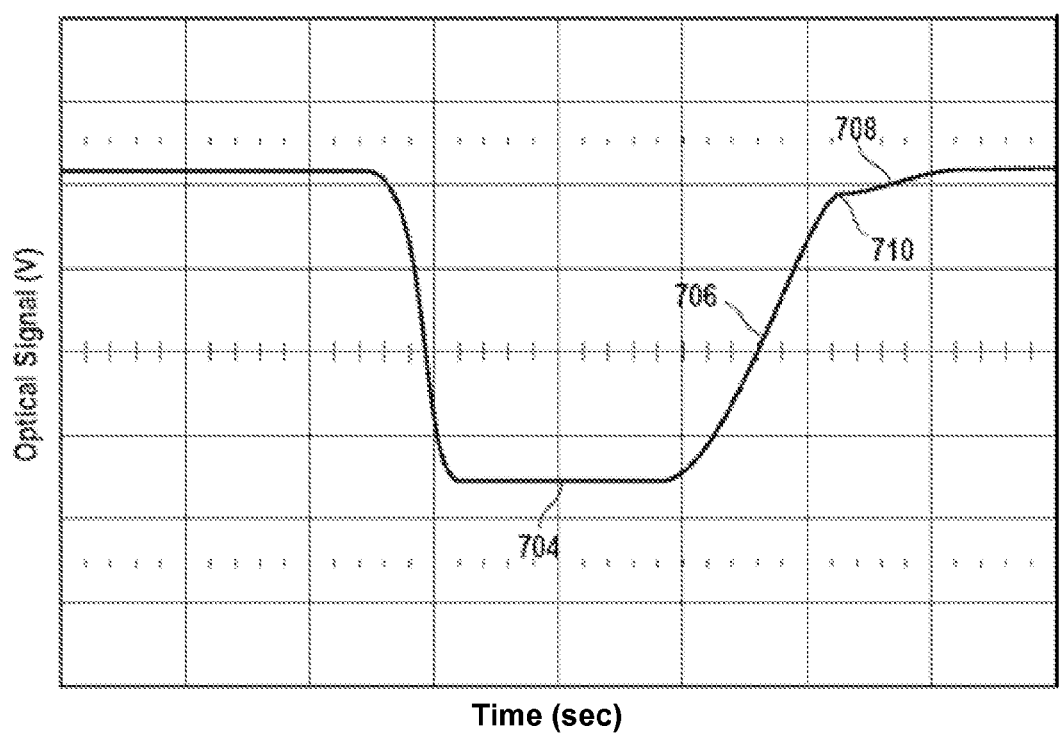
FIG. 7B is a graph of the optical signal from an optical detector as a function of time during a pulsing sequence according to an embodiment of the present invention.

FIG. 7B is a graph of the optical signal from optical detector 284 as a function of time during a pulsing sequence. Optical signal 704 is associated with a drop of fluid protruding from the nozzle tip 286. Optical signal 706 is associated with the drop of fluid being drawn back, or sucked back, to nozzle tip 286. Point 710 is associated with the fluid being flush with nozzle tip 286. Optical signal 708 is associated with the fluid being sucked back from nozzle tip 286 and into dispense nozzle 264. Thus, utilizing embodiments of the present invention, the position of the fluid within the nozzle is controllable using the optical signal illustrated in FIG. 7B along with appropriate control electronics and the like. One of ordinary skill in the art would recognize many variations, modifications, and alternatives.

Figure 8:
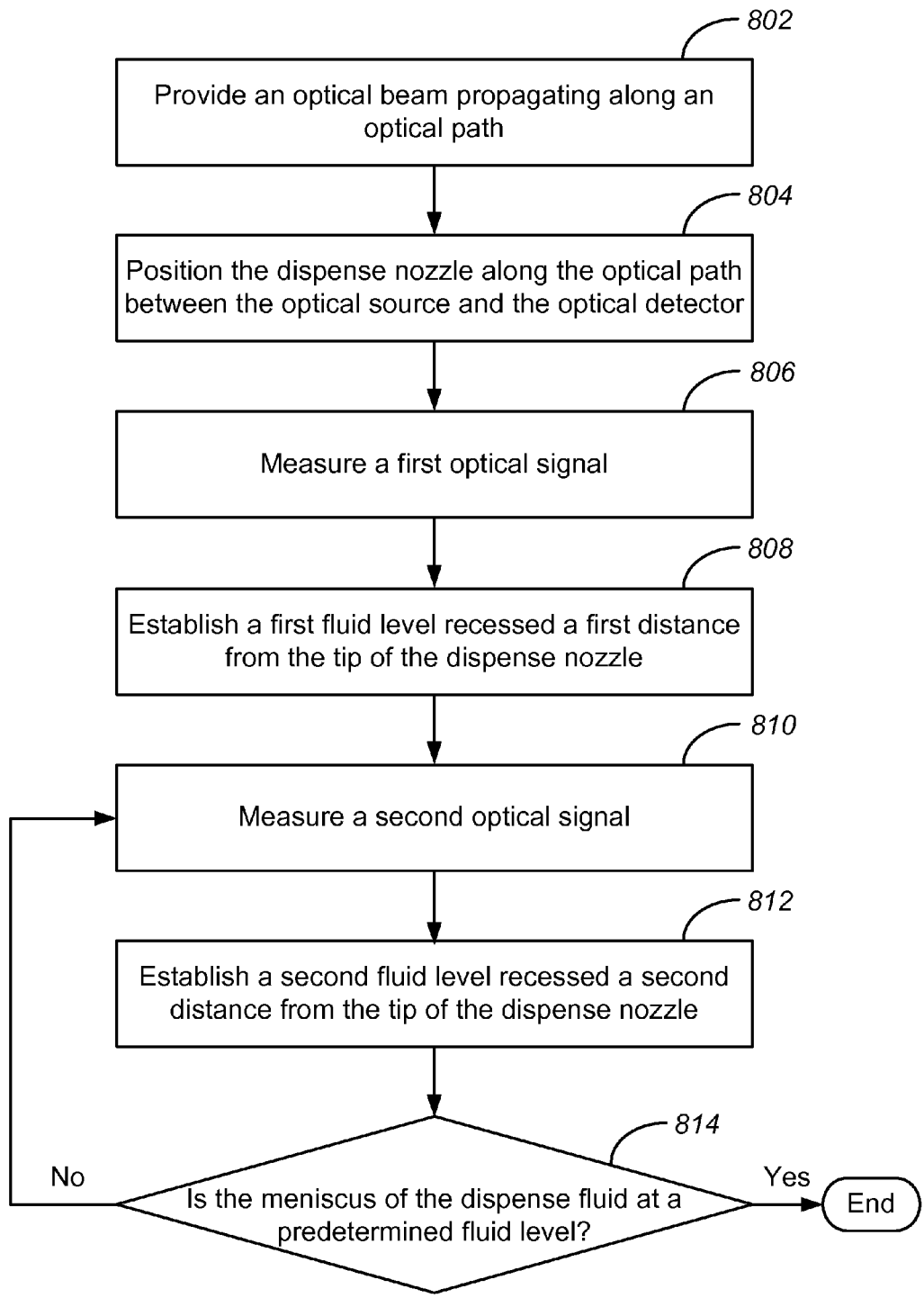
FIG. 8 is a simplified flowchart illustrating a method of providing a predetermined fluid level in a dispense nozzle according to an embodiment of the present invention.

FIG. 8 is a simplified flowchart illustrating a method of providing a predetermined fluid level in a dispense nozzle 264 according to an embodiment of the present invention. Step 802 includes providing an optical beam 320 which propagates along an optical path between an optical source 282 and an optical detector 284. Step 804 positions the dispense nozzle 264 between the optical source 282 and the optical detector 284 as described previously. A first optical signal is measured in step 806 followed by step 808 which adjusts the fluid position depending on the first optical signal. A second optical signal is measured in step 810 followed by step 812 which again adjusts the fluid position depending on the second optical signal. If the meniscus of the fluid interface level matches a predetermined fluid level as determined by comparing the optical signal with baseline optical signal data, the process is terminated. If not, then steps 810 and 812 are repeated.

It should be appreciated that the specific steps illustrated in FIG. 8 provide a particular method of providing a predetermined fluid level in a dispense nozzle according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

FIG. 9 is a graph of the optical signal from optical detector 284 corresponding to various positions of a fluid interface and various flow characteristics of the fluid according to an embodiment of the present invention. The fluid interface positions corresponding to the optical signal include a drop protruding from the tip of the dispense nozzle (902), fluid flush with the tip of the dispense nozzle (906), a drop being sucked back up to the tip of dispense nozzle (910), and the fluid being sucked back from the tip and into dispense nozzle (912), respectively. The flow characteristics corresponding to the optical signal include fluid dispense in a continuous stream (904) and a dribble or intermittent flow (908). These positions and various other positions and characteristics can be monitored and controlled using embodiments of the present invention. In addition, the positions and characteristics can be monitored over time to proactively predict process drift or to detect signs of imminent failure.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A method of providing a predetermined fluid level of a dispense fluid in a dispense nozzle of a semiconductor process module, the method comprising:
a) providing an optical beam propagating along an optical path, wherein the optical beam is provided by an optical source;
b) positioning the dispense nozzle along the optical path at a first location between the optical source and an optical detector coupled to the optical path, the first location being characterized by a first position measured along a first direction aligned with a dispense direction such that the optical beam impinges on the dispense nozzle;
c) establishing a first fluid level recessed a first distance from a tip of the dispense nozzle;
d) measuring a first optical signal utilizing the optical detector;
e) establishing a second fluid level recessed a second distance from the tip of the dispense nozzle, wherein the second distance is greater than the first distance;
f) measuring a second optical signal utilizing the optical detector; and
g) repeating steps (e) and (f) until a meniscus of the dispense fluid is associated with the predetermined fluid level.

2. The method of claim 1 wherein establishing the first fluid level comprises operating a valve coupled to the dispense nozzle.

3. The method of claim 1 wherein positioning the dispense nozzle comprises aligning the dispense nozzle such that a first portion of the optical beam impinges on the dispense nozzle and a second portion of the optical beam is free from impingement on the dispense nozzle.

4. The method of claim 1 wherein the optical source comprises a linear array of optical emitters.

5. A system for controlling a semiconductor process fluid dispense operation, the system comprising:
an extended optical source adapted to provide an optical beam propagating along an optical path, wherein the optical beam is characterized by a path width measured in a first direction aligned with a dispense direction;
an optical detector array coupled to the optical path and adapted to detect at least a portion of the optical beam and to provide an optical signal;
a dispense nozzle disposed along the optical path at a location between the extended optical source and the optical detector array, wherein the dispense nozzle is adapted to support the semiconductor process fluid;
a suck back valve coupled to the dispense nozzle and adapted to modify a position of a semiconductor process fluid interface in the dispense nozzle; and
a processor coupled to the optical detector array and the suck back valve, wherein the processor is adapted to adjust the position of the semiconductor process fluid interface in response to the optical signal provided by the optical detector array.

6. The system of claim 5 wherein the dispense nozzle is characterized by a proximal portion adjacent to a proximal end of the dispense nozzle and a distal portion adjacent to a distal end of the dispense nozzle.

7. The system of claim 6 wherein the processor comprises:
an input adapted to receive a first optical signal;
a comparator adapted to compare the first optical signal to a baseline optical signal; and
an output adapted to provide:
a first signal to the suck back valve if the optical signal is less than a baseline signal, and
a second signal to the suck back valve if the optical signal is greater than the baseline signal.

8. The system of claim 7 wherein the first signal is associated with the position of the semiconductor process fluid interface being less than a predetermined distance from the distal end of the nozzle.

9. The system of claim 8 wherein the second signal is associated with the position of the semiconductor process fluid interface being greater than a predetermined distance from the distal end of the nozzle.

10. The system of claim 9 wherein the predetermined distance ranges from about 1 mm to about 2 mm.

11. The system of claim 5 wherein the dispense nozzle is disposed along the optical path such that a first portion of the optical beam impinges on the dispense nozzle and a second portion of the optical beam is free from impingement on the dispense nozzle.

12. The system of claim 5 wherein the spatial extent of the extended optical source substantially matches the spatial extent of the optical detector array.

* * * * *